United States Patent
Kato

(10) Patent No.: US 7,135,725 B2
(45) Date of Patent: Nov. 14, 2006

(54) SOLID-STATE IMAGING DEVICE AND METHOD FOR MANUFACTURING THE SAME

(75) Inventor: Yoshiaki Kato, Kusatsu (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 137 days.

(21) Appl. No.: 10/991,007

(22) Filed: Nov. 16, 2004

(65) Prior Publication Data

US 2005/0110059 A1    May 26, 2005

(30) Foreign Application Priority Data

Nov. 20, 2003  (JP) .............................. 2003-391114
Oct. 22, 2004  (JP) .............................. 2004-308424

(51) Int. Cl.
*H01L 31/062* (2006.01)
(52) U.S. Cl. ...................................... 257/291; 257/436
(58) Field of Classification Search ................ 257/291, 257/292, 294, 436
See application file for complete search history.

(56) References Cited

U.S. PATENT DOCUMENTS

2005/0110059 A1*  5/2005  Kato ........................... 257/291

FOREIGN PATENT DOCUMENTS

| JP | 6-224398 | 8/1994 |
|---|---|---|
| JP | 2869280 | 12/1998 |

* cited by examiner

*Primary Examiner*—Mark V. Prenty
(74) *Attorney, Agent, or Firm*—Hamre, Schumann, Mueller & Larson, P.C.

(57) ABSTRACT

A solid-state imaging device of the present invention is provided with a plurality of photodiodes arranged in a one-dimensional or a two-dimensional arrangement, inorganic dielectric films that are made of a translucent inorganic substance, formed on the photodiode, and a hollow layer that is formed within the inorganic dielectric film and sandwiched between an inner lateral wall and an outer lateral wall formed with the inorganic dielectric film, wherein the hollow layer has a funnel shape whose aperture widens from an end portion near an upper portion of the photodiode with increasing distance from the photodiode. Light that is incident on a region above the photodiode area can be focused effectively onto the photodiode over a wide range.

7 Claims, 10 Drawing Sheets

SOLID-STATE IMAGING DEVICE AND METHOD FOR MANUFACTURING THE SAME

FIELD OF THE INVENTION

The present invention relates to solid-state imaging devices that can be employed in digital still cameras, composite video cameras, and the like, and methods for manufacturing the same.

BACKGROUND OF THE INVENTION

In recent years, solid-state imaging devices have come to be employed widely in the imaging portion of, for example, composite video cameras and digital still cameras. Of these, interline-transfer type CCD solid-state imaging devices (hereinafter, referred to as IT-CCDs) are particularly popular because of their low noise properties.

FIG. 8 is a diagram that schematically shows the configuration of an ordinary IT-CCD. In FIG. 8, reference numeral 1 denotes photodiodes having a photoelectric conversion function, 2 denotes vertical transfer portions that have a buried channel structure and that are for transferring signal charges in the vertical direction, 3 denotes vertical transfer gates that control vertical transfer, 4 denotes a horizontal transfer portion for transferring signal charges in the horizontal direction, and 5 denotes an output portion.

FIG. 9 is a diagram illustrating a unit pixel P, which includes a photodiode 1, a vertical transfer portion 2, and a vertical transfer gate 3 of FIG. 8. FIG. 10 schematically shows a cross-section taken along the line A–A' in FIG. 9. In FIG. 10, the photodiode 1 and the vertical transfer portion 2 are formed within a silicon substrate 11. The vertical transfer gate 3 is formed on the silicon substrate 11. Reference numeral 6 denotes a light-blocking film that has been provided such that incident light is kept from being incident on regions other than the photodiode 1, such as on the vertical transfer portion 2. 8a and 8b are a first and a second dielectric film, respectively, having $SiO_2$ as a main component, and 10 is a protective film. An organic dielectric film 12 is formed on the protective film 10 and planarized. A lens 7 made of an organic film is formed on the organic dielectric film 12, and focuses incident light into the photodiode 1. The dielectric film 12 functions both as a planarizer and as a color filter.

FIGS. 11A and 11B show the process steps in producing the above conventional solid-state imaging device. FIG. 11A shows a cross-section at a state where the light-blocking film 6, the second dielectric film 8b, and then the protective film 10 have been formed. It should be noted that after the second dielectric film 8b is formed, it is subjected to a thermal flow process to provide it in the shape illustrated here. After the protective film 10 is formed, as shown in FIG. 11B, the organic dielectric film 12 and then the lens 7 are formed.

However, the solid-state imaging device of the above structure has the problem that it cannot effectively utilize the incident light when focusing by the lens 7 is not sufficient. That is, when light is perpendicularly incident on the solid-state imaging device, it is effectively focused by the lens 7 and usefully incident on the photodiode 1, but when the angle of incidence has deviated from the perpendicular direction, the incident light is not focused onto the photodiode 1 and is diffusely reflected by the surface of the light-blocking film 6, and this did not allow the incident light to be effectively utilized.

In particular, as cameras have become more compact, the miniaturization of the unit pixels of solid-state imaging devices and the shortening of the exit pupil length of the lens used in cameras have become remarkable, and thus the problem mentioned above has become even more pronounced. For example, although more compact unit pixels have led to a shrinking of the photodiode aperture width W, which is the aperture of the light-blocking film 6, the film thickness of the vertical transfer gates 3 cannot be provided thin proportional to the extent to which the aperture width is reduced. This has resulted in a structure having a pit shape with a narrow aperture, making focusing of the incident light difficult. Further, shorter exit pupil distances in the camera lens are one cause for the increase in the ratio of light incident on the solid-state imaging device whose angle has deviated from the perpendicular direction, and this, too, makes it difficult to achieve effective focusing of incident light onto the photodiode 1.

In response to the above problems, Japanese Patent No. 2869280 discloses a structure for increasing the sensitivity, resolution, and image quality by providing a low refraction region layer in the lateral wall of the light path formation portion positioned above the photoelectric conversion portion, so as to cause light that is incident into the lateral area of the transfer electrode or light that is diffused to adjacent pixels to be incident on the photoelectric conversion portion. Japanese Patent No. 2869280 discloses a method for forming a gas layer as the low refraction region layer by applying a soluble resin, covering that resin with another resin, and then dissolving the soluble resin to form the gas layer (paragraphs 0008 and 0014; see FIG. 1).

The structure of the low refraction region layer disclosed in Japanese Patent No. 2869280, however, is not sufficient for focusing the light that is incident on the area above the photodiode area onto the photodiode over a wide range.

In other words, that light that is incident on an intermediate region between the photodiode 1 and other surrounding photodiodes is incident on the light-blocking film 6 at an angle close to a right angle, and thus reflection occurs at the surface of the light-blocking film 6 and it was not possible to focus the light that is incident on this region onto the photodiode 1.

Also, with the manufacturing method disclosed in Japanese Patent No. 2869280, it was difficult to uniformly apply a thin soluble resin onto the surface of a solid-state imaging device that has severe unevenness, because liquid pools are formed in the recessed portions, entire recessed portions are buried with the resin, or bubbles without resin are formed in some of the recessed portions. Thus it was not easy to obtain a low refraction region layer with uniform properties.

SUMMARY OF THE INVENTION

It is an object of the present invention to provide a solid-state imaging device with which light that is incident on the area above the photodiode vicinity can be effectively focused onto the photodiode over a wide range.

It is a further object to provide a method for manufacturing a solid-state imaging device with which a low refraction region layer having uniform properties can be formed with ease.

A solid-state imaging device of the present invention is provided with a plurality of photodiodes arranged in a one-dimensional or a two-dimensional arrangement, an inorganic dielectric film made of a translucent inorganic substance, formed on the photodiode, and a hollow layer that is formed within the inorganic dielectric film and sandwiched between an inner lateral wall and an outer lateral wall formed with the inorganic dielectric film, wherein the hollow layer has a funnel shape whose aperture widens from an end portion near an upper portion of the photodiode with increasing distance from the photodiode.

A method for manufacturing a solid-state imaging device of the present invention includes: forming an outer wall dielectric film made of an inorganic substance at least above a peripheral area of each of a plurality of photodiodes formed arranged in a one-dimensional or a two-dimensional arrangement on a semiconductor substrate; forming a hollow forming dielectric film made of an inorganic substance that is different from the outer wall dielectric film on the outer wall dielectric film; removing by etching an area of the hollow forming dielectric film that corresponds to a photodiode aperture portion; forming an inner wall dielectric film, made of an inorganic substance that is different from the hollow forming dielectric film, on the outer wall dielectric film and the hollow forming dielectric film; planarizing the inner wall dielectric film; etching the inner wall dielectric film at the outer peripheral portion of a border of a unit cell that includes a single photodiode, up to the hollow forming dielectric film; and forming a hollow layer by selectively etching the hollow forming dielectric film sandwiched between the outer wall dielectric film and the inner wall dielectric film, using the outer wall dielectric film and the inner wall dielectric film as masks.

DESCRIPTION OF THE PREFERRED EMBODIMENTS

Figure 1:
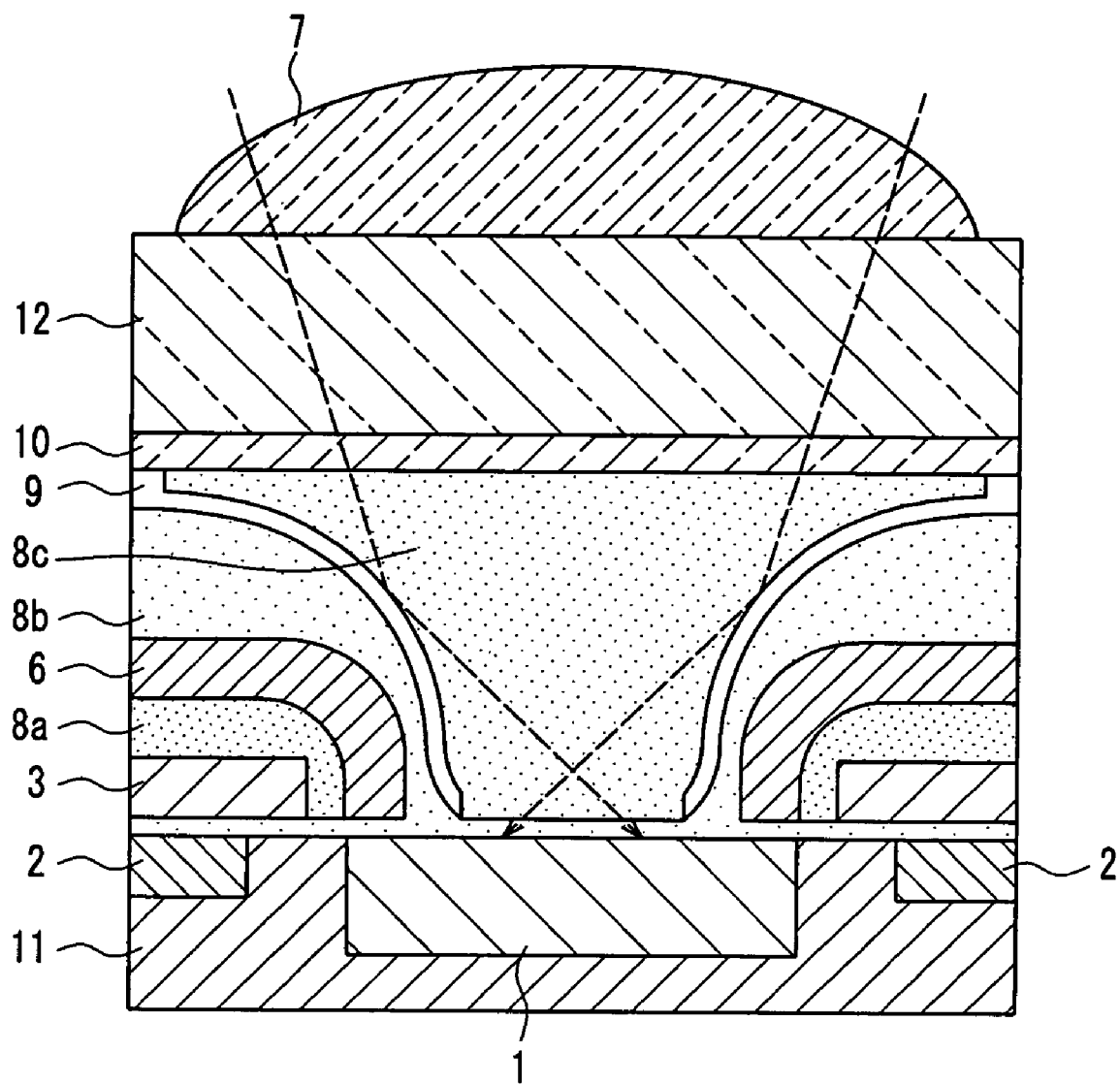
FIG. 1 is a cross sectional view showing the cross-sectional structure of a solid-state imaging device according to the first embodiment.

According to the solid-state imaging device of the present invention having the above structure, a hollow layer is provided to maximize the refractive index difference between the dielectric films, and by utilizing total reflection, it is possible to effectively focus incident light onto the photodiode. Moreover, because the hollow layer has a funnel shape, the light that is incident on an area above the photodiode can be effectively focused onto the photodiode over a wide range. Therefore, the problem of the photodiode coming to have a deep shaft shape in conjunction with the unit pixels of the solid-state imaging device becoming smaller in size and the problem of changes in the incident light angle due to shorter ejection pupil distances of the camera lens are solved, allowing good image-capturing properties to be obtained.

Also, according to the manufacturing method of the present invention discussed above, the hollow layer can be formed uniformly.

It is preferable that the solid-state imaging device of the present invention further includes a CCD that is disposed adjacent to the photodiode and that transfers charge that has been photoelectrically converted and held by the photodiode, and a light-blocking film that is formed below the hollow layer and covers the CCD, and that has an aperture portion above the photodiode, and that the end portion of the hollow layer is positioned inward of the aperture portion of the light-blocking film.

It is further preferable to adopt a configuration in which the aperture of the hollow layer at a position that is located a predetermined distance away from the photodiode is larger than the aperture portion of the light-blocking film. Thus, guiding of the incident light utilizing total reflection can be achieved over a wider range. It is also preferable that the inner lateral wall and the outer lateral wall made of the inorganic dielectric film that form the hollow layer are formed substantially parallel. Thus, the widest possible area for the inner region of the hollow layer can be secured according to the shape of the primer, and therefore the light focusing region can be maximized. It is also preferable that an end portion of the light-blocking film in the vicinity of the photodiode is positioned higher than the lowest portion of the hollow layer. Thus, guiding of the incident light is utilized to widen the aperture of the photodiode, allowing the sensitivity to be increased. Also, by adopting a configuration in which the hollow layer has a step portion, it is possible to further increase the region over which total reflection is possible to a region wider than the aperture portion of the light-blocking film.

When unit pixels have become smaller in size and the photodiode surface is located in a deep portion, the hollow layer can have a shape that rises upward substantially perpendicular to the origin of the photodiode upper portion in a deep portion or some of whose aperture narrows near the photodiode center and widens at a sufficiently upper portion. In this case as well, the light that has been focused at an upper portion is efficiently guided to the photodiode, which is in a deep portion, due to guiding by total reflection.

Even if the hollow layer does not have a shape that rises upward substantially perpendicular to the origin of the photodiode upper portion in a deep portion or some of whose aperture narrows near the photodiode center and widens at a sufficiently upper portion, the light that is focused at the upper portion hollow layer aperture is efficiently guided to the photodiode, which is in a deep portion, due to guiding by total reflection, allowing the effect of utilizing the hollow layer to guide the incident light by total reflection to be sufficiently obtained.

It preferable that the method for manufacturing a solid-state imaging device of the present invention further includes: etching the outer wall dielectric film to a predetermined depth in a region that is larger than the aperture portion of the photodiode and smaller than the border portion of the unit cell, which is provided with a single photodiode, before the step of forming the hollow forming dielectric film on the outer wall dielectric film. It is also preferable that an end portion of the light-blocking film in the photodiode vicinity is formed higher than the lowest portion of the hollow layer.

It is also possible that the method for manufacturing a solid-state imaging device of the present invention further includes: forming a light-blocking film having an aperture portion above the photodiode, above the area around the plurality of photodiodes before the step of forming the outer wall dielectric film, and that in the step of forming the outer wall dielectric film, the outer wall dielectric film, which is made of an inorganic substance, is formed above the light-blocking film and the photodiode.

It is also possible that the outer wall dielectric film and the inner wall dielectric film are formed by films having $SiO_2$ as a main component, and that the hollow forming dielectric film is formed by a film having SiN as a main component. In this case, it is possible for the hollow forming dielectric film to be etched using a gas having Cl, F, or both, as a main component. Alternatively, it is also possible for the hollow forming dielectric film to be etched using a gas having an active species of Cl, an active species of F, or both, as a main component, and that during the etching process, the temperature of the stage on which a wafer is placed is set to at least 50° C.

It is also possible that the outer wall dielectric film and the inner wall dielectric film are formed by films having SiN as a main component, and the hollow forming dielectric film is formed by a film having $SiO_2$ as a main component. In this case, it is possible for the hollow forming dielectric film to be etched using a solution having HF as a main component. Alternatively, it is also possible for the hollow forming dielectric film to be etched using a gas having an active species of $C_xH_y$ as a main component.

It is also possible for the outer wall dielectric film to be formed by a film having $SiO_2$ as a main component, the hollow forming dielectric film to be formed by a film having SiN as a main component, and the inner wall dielectric film to be formed by a SiON film.

It is also possible for the inner wall dielectric film to be silica glass, and for the manufacturing method to include applying and annealing the silica glass. Alternatively, it is also possible to include planarization through CMP (chemical mechanical polishing) after the inner wall dielectric film is formed.

It is also possible for the hollow forming dielectric film to be a conducting film. For example, the outer wall dielectric film and the inner wall dielectric film can be formed by films having $SiO_2$ as a main component, and the hollow forming dielectric film can be formed by a film having Si as a main component. In this case, it is possible for the hollow forming dielectric film to be etched using a gas having a halogen element as a main component.

It is also possible for the hollow forming dielectric film to be formed by a film having a high melting point metal component.

It should be noted that the present invention is not limited to CCD solid-state imaging devices, and the same effects can be achieved when the present invention is applied to MOS-type solid-state imaging devices. The present invention can be adopted for solid-state imaging devices that are provided with a photodiode capable of photoelectric conversion, regardless of the manner in which the device is structured.

Figure 8:
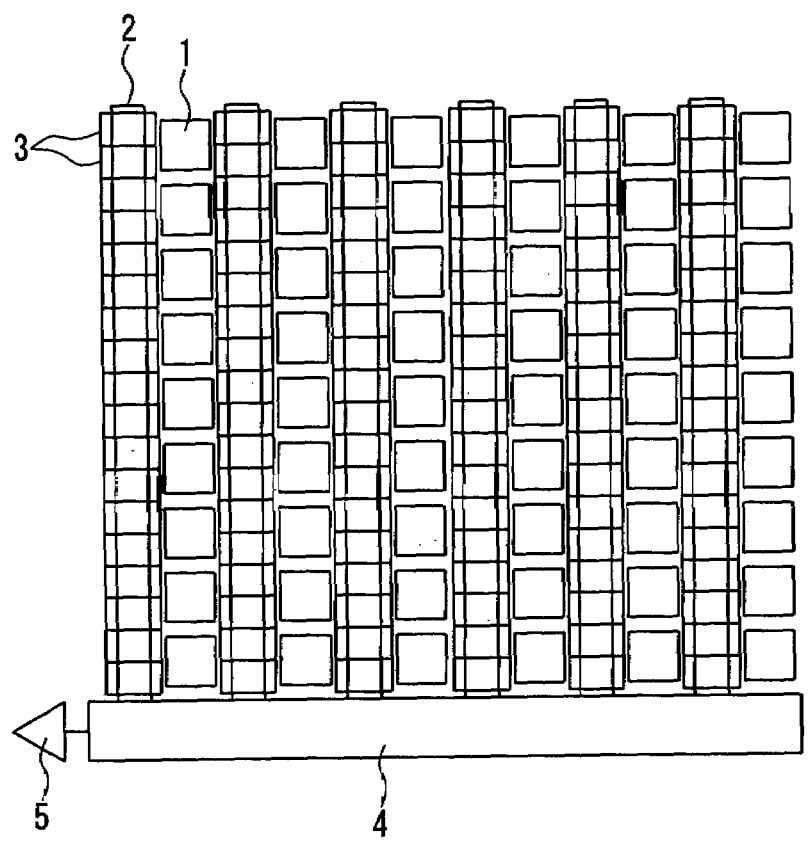
FIG. 8 is a plan view showing an overview of the configuration of a conventional solid-state imaging device.

Hereinafter, embodiments of the present invention are described in detail with reference to the drawings. It should be noted that the solid-state imaging devices of the various embodiments have the same overall structure as the conventional example shown in FIG. 8. In the following reference drawings and description, the configuration of the same region as the region of the unit pixel shown in FIG. 9 is described.

First Embodiment

Figure 9:
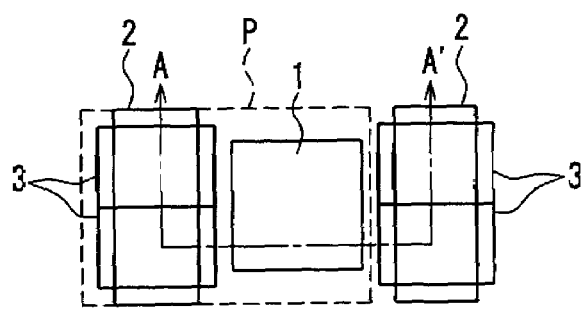
FIG. 9 is a plan view showing an overview of the configuration of a unit pixel of the conventional solid-state imaging device.
Figure 10:
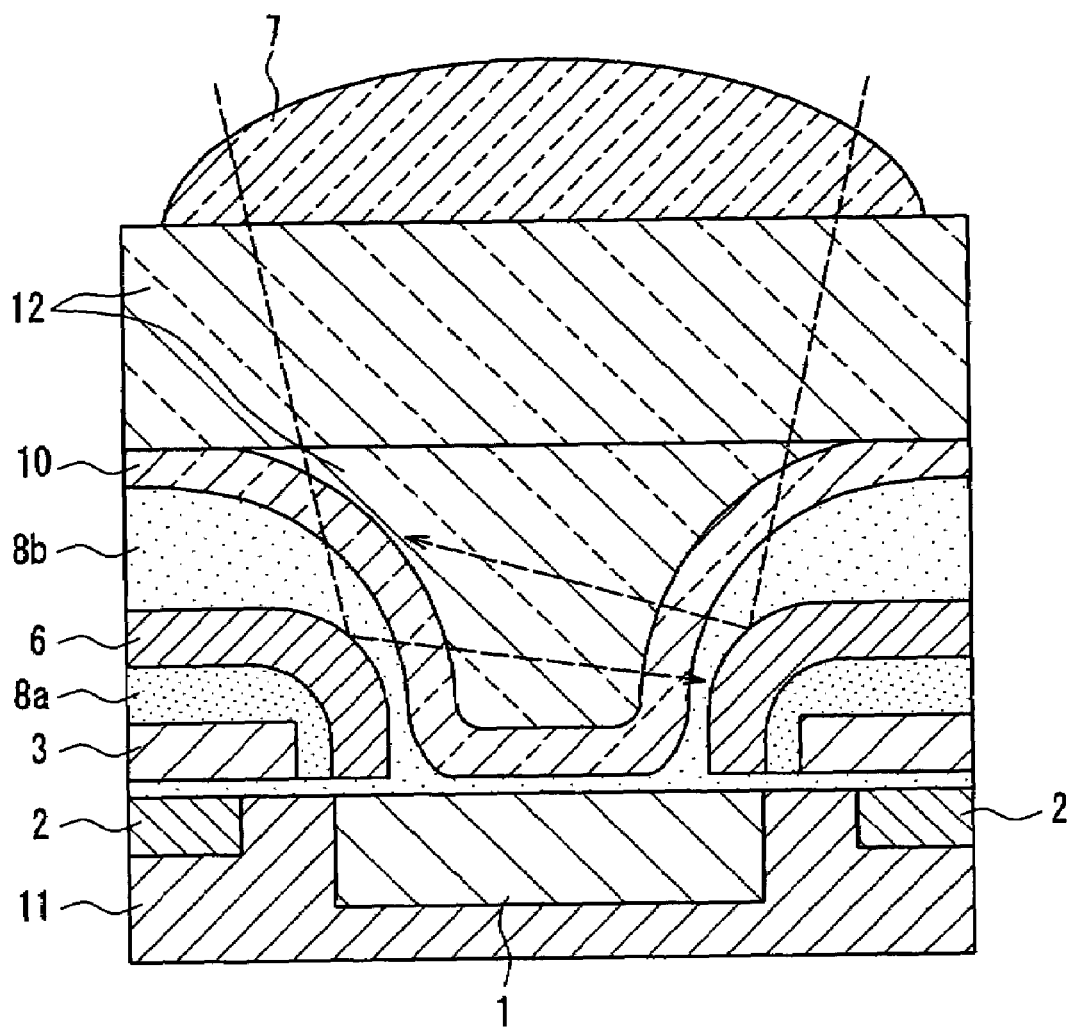
FIG. 10 is a cross sectional view showing the cross-sectional structure along the line A–A' in FIG. 9.
Figure 11A:
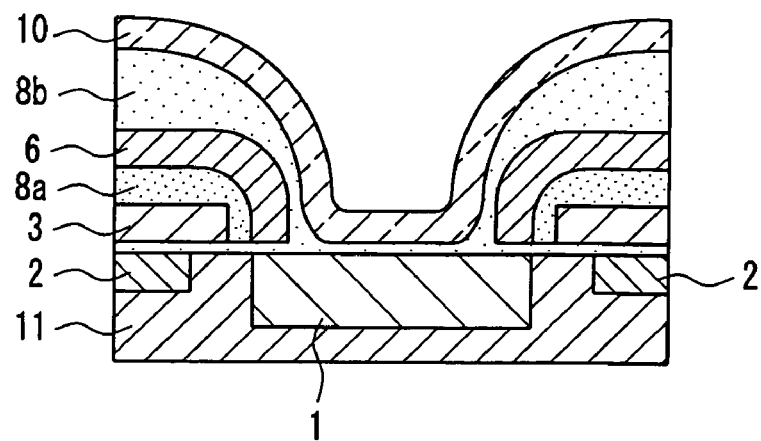
FIGS. 11A and 11B are cross sectional views showing the method for manufacturing the conventional solid-state imaging device.
Figure 11B:
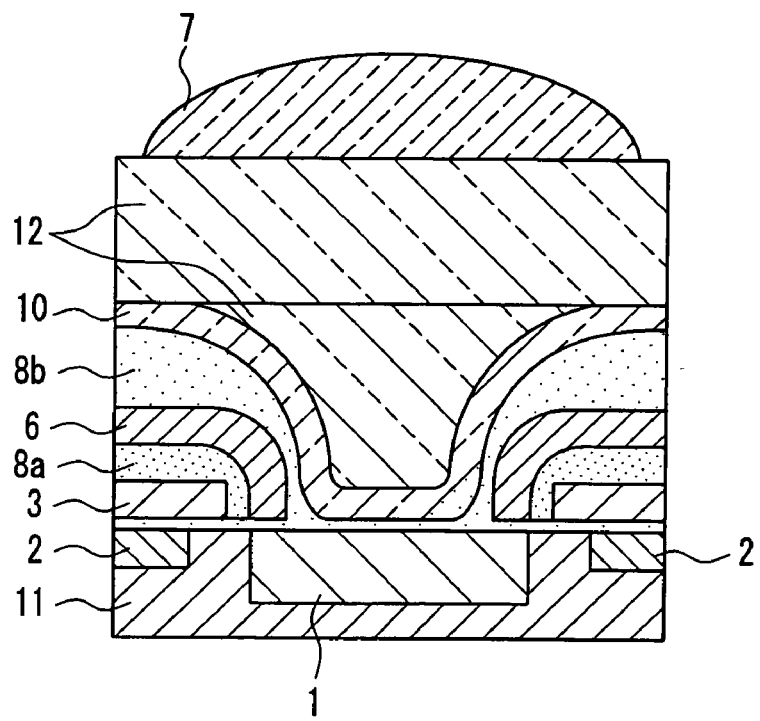

FIG. 1 shows the cross-sectional structure of the solid-state imaging device according to a first embodiment of the present invention, and is a cross-sectional view taken along the line A–A' of FIG. 9.

In FIG. 1 the reference numeral 1 denotes a photodiode and 2 denotes a vertical transfer portion having a buried channel structure, both formed within a silicon substrate 11. A vertical transfer gate 3 is formed above the silicon substrate 11. Reference numeral 6 denotes a light-blocking film that is provided such that it blocks regions other than the photodiode 1, such as the vertical transfer portion 2, from the incident light. Dielectric films 8a, 8b, and & having an inorganic substance such as $SiO_2$ as their main component are formed above the vertical transfer gate 3 and sandwich the light-blocking film 6. The dielectric films 8b and 8c allow light to pass and respectively form the outer wall and the inner wall of a hollow layer 9. For this reason, in the description that follows, the dielectric films 8b and 8c are referred to as the outer wall dielectric film and the inner wall dielectric film, respectively. The hollow layer 9 is formed in the shape of the lateral wall of a funnel whose aperture originates at the area around the photodiode 1 and widens with increased distance from the photodiode 1.

A protective film 10 is formed on the upper surface of the inner wall dielectric film 8c. An organic dielectric film 12 is formed on the protective film 10 and has been planarized. A lens 7 made of an organic film is provided on the organic dielectric film 12, and focuses incident light onto the photodiode 1. The dielectric film 12 functions as both a planarizer and a color filter.

In the solid-state imaging device of the first embodiment described above, at the border portion between the hollow layer 9 and the inner wall dielectric film 8c, the refractive index of the inner wall dielectric film 8c is larger than that of the hollow layer 9 which has a vacuum dielectric constant of 1, so that the refractive index difference is at a maximum. Consequently, total reflection occurs from the inner wall dielectric film 8c at its interface with the hollow layer 9 in accordance with that refractive index difference.

When n is the refractive index of the inner wall dielectric film 8c, then the total reflection angle $\theta$ is the angle expressed by:

$$\cos\theta = 1/n \qquad \text{(Formula 1)}$$

When n is 1.5, then $\theta$ is 48.1° according to Formula 1. This means that total reflection occurs at the border between the inner wall dielectric film 8c and the hollow layer 9 in a range from a direction tangential to that border surface up to a direction with an angle of 48.1°. As a result, light can be effectively focused onto the photodiode 1 due to the guiding of incident light by total reflection along the interface with the hollow layer 9, even if the incident light is not focused directly onto the aperture portion of the photodiode 1 by the lens 7.

Also, with the technology of Japanese Patent No. 2869280, the hollow layer is above the vertical transfer gate (transfer electrode), and is near perpendicular to the incident light, but in the present embodiment the hollow layer 9 is formed in the shape of the inner wall of a funnel. Thus, light can be focused onto the photodiode 1 over a wide range, even in a case of light that is incident above the vertical transfer gate 3.

Further, in this embodiment, the hollow layer 9 is formed substantially parallel to the shape of the outer wall dielectric film 8b (the thickness of the hollow layer 9 remains uniform). Consequently, at the section where the shape of the outer wall dielectric film widens outward, the hollow layer 9 is formed so that it also widens along the outer wall dielectric film 8b. It is thus possible to maximize the inner wall region of the hollow layer 9 that is for focusing light, and this further increases the ability to focus light onto the photodiode 1.

It should be noted that according to the present embodiment, incident light is efficiently guided to the photodiode 1 and unnecessary light can be kept from entering the vertical transfer portion 2, and thus the light-blocking film 6 is not absolutely necessary.

As a method for manufacturing the hollow layer 9, it is possible to adopt a method in which a dielectric film that is sandwiched between two dielectric films is removed by etching through isotropic etching. A method for manufacturing the solid-state imaging device having the above structure is described below with reference to FIGS. 2A to 2F.

Figure 2A:
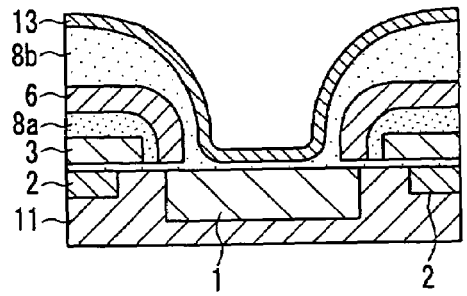
FIGS. 2A to 2F are cross sectional views showing the method for manufacturing that solid-state imaging device.

FIG. 2A shows a state in which the light-blocking film 6 and then the outer wall dielectric film 8b are formed, after which a hollow forming dielectric film 13, which is a dielectric film having SiN as a main component, has been formed. The processes up to forming the outer wall dielectric film 8b are identical to those of the method for manufacturing the conventional solid-state imaging device. The outer wall dielectric film 8b is provided in the shape that is shown in the diagram by executing thermal flow processing after the film is formed. The hollow forming dielectric film 13 is formed using CVD or the like in which the formation temperature of the film has been lowered, utilizing plasma or UV light, for example.

Figure 2D:
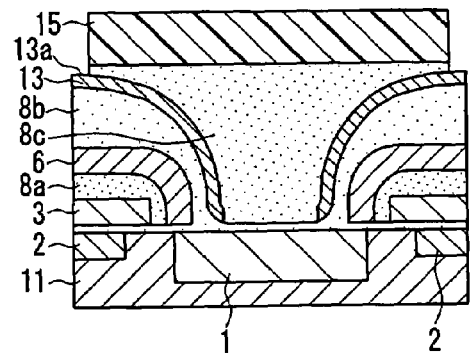
Figure 2B:
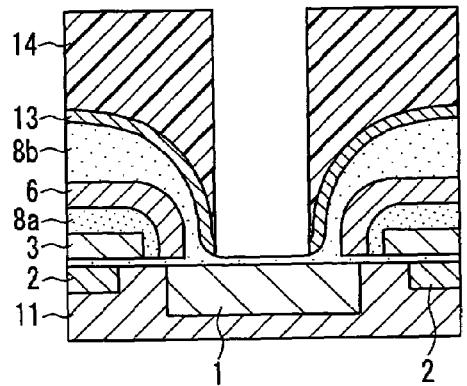

Next, as shown in FIG. 2B, a photoresist 14 is patterned such that it is open above the photodiode 1, thereby etching the hollow forming dielectric film 13. Next, the photoresist 14 is removed and the inner wall dielectric film 8c is formed and subjected to planarization, producing the state shown in FIG. 2C. Then, as shown in FIG. 2D, the pattern of a photoresist 15 is formed, and the inner wall dielectric film 8c is etched at the border portion with adjacent unit cells, forming an exposed portion 13a of the hollow forming dielectric film 13.

Figure 2E:
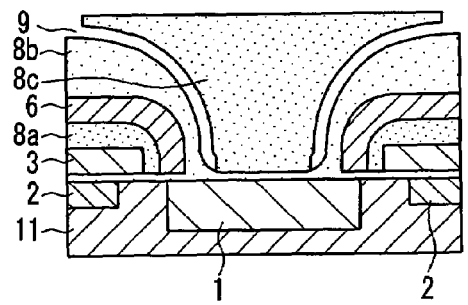
Figure 2C:
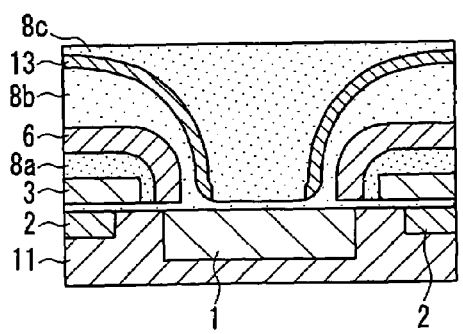
Figure 2F:
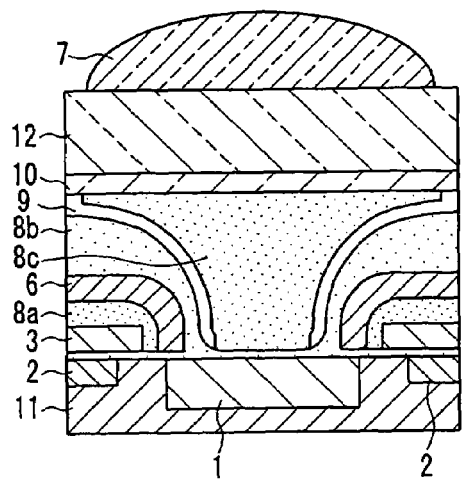

Next, as shown in FIG. 2E, the photoresist 15 is removed and the hollow forming dielectric film 13 is removed from the exposed portion 13a by etching. As a result, the hollow layer 9 is formed. By dry etching using a gas having either F (fluorine) or Cl (chlorine), such as $CF_4$ or $CCl_4$, as its primary etching component to etch the hollow forming dielectric film 13, only the hollow forming dielectric film 13, which has SiN as a main component, is removed selectively. Next, as shown in FIG. 2F, the entire structure is covered by the protective layer 10, and then the organic film 12 and the organic film lens 7 are formed.

In the manufacturing processes described above, an SiN film, that is, the hollow forming dielectric film 13, is etched with plasma whose active species is F or Cl and thus isotropism and sufficient selectivity with respect to $SiO_2$ films can be obtained, and this allows the hollow layer to be formed favorably.

Further, because the SiN film is formed using a film formation method such as CVD, the problem of nonuniform film formation, which is a problem when employing a method of applying a soluble resin, such as in Japanese Patent No. 2869280, is completely absent.

Also, when a Si film is used in place of the above SiN film as the hollow forming dielectric film 13, the Si readily reacts with the active species F or Cl and even better etching properties are obtained. The same applies when etching using a HF solution or an active species of a $C_xH_y$ gas when the $SiO_2$ film is sandwiched between SiN films.

Also, when etching the hollow forming dielectric film 13, it is also possible to not use an organic photoresist and instead use the inner wall dielectric film 8c that has been patterned as a photoresist. This is because when the photoresist is used during dry etching, products generated from the photoresist during etching become etching active species, lowering the selectivity. With the technology of the present embodiment, a photoresist is not used when etching the hollow forming dielectric film 13, and thus good selectivity can be obtained. Moreover, even when performing wet etching with HF, it is possible to prevent photoresist peeling or the like that may occur during long-duration etching, and this allows the manufacturing processes to be carried out stably.

When dry etching is used to form the hollow layer 9 described above, wafer temperature control is crucial. When the wafer temperature becomes low, the reaction products that are generated by etching readhere to the lateral wall of the hollow layer 9 and the lateral wall of the etching chamber. When the reaction products adhere to the lateral wall of the hollow layer 9, the etching for hollowing stops before it reaches a predetermined depth. When the reaction products adhere to the lateral wall of the etching chamber, these become dust and fall onto the water surface, interfering with etching and requiring the inside of the etching chamber to be cleaned frequently. To prevent either of these from occurring, a significant effect is obtained by maintaining a wafer stage temperature within the etching chamber of at least 50° C. In particular, $C_xH_y$-based gas is prone to readhering, making temperature management essential.

It is also possible to use silica gas as the inner wall dielectric film 8c, applying silica glass and then annealing the silica glass to form the inner wall dielectric film 8c.

Also, after forming the inner wall dielectric film 8c, it can be planarized by CMP (Chemical Mechanical Polishing).

Second Embodiment

Figure 3:
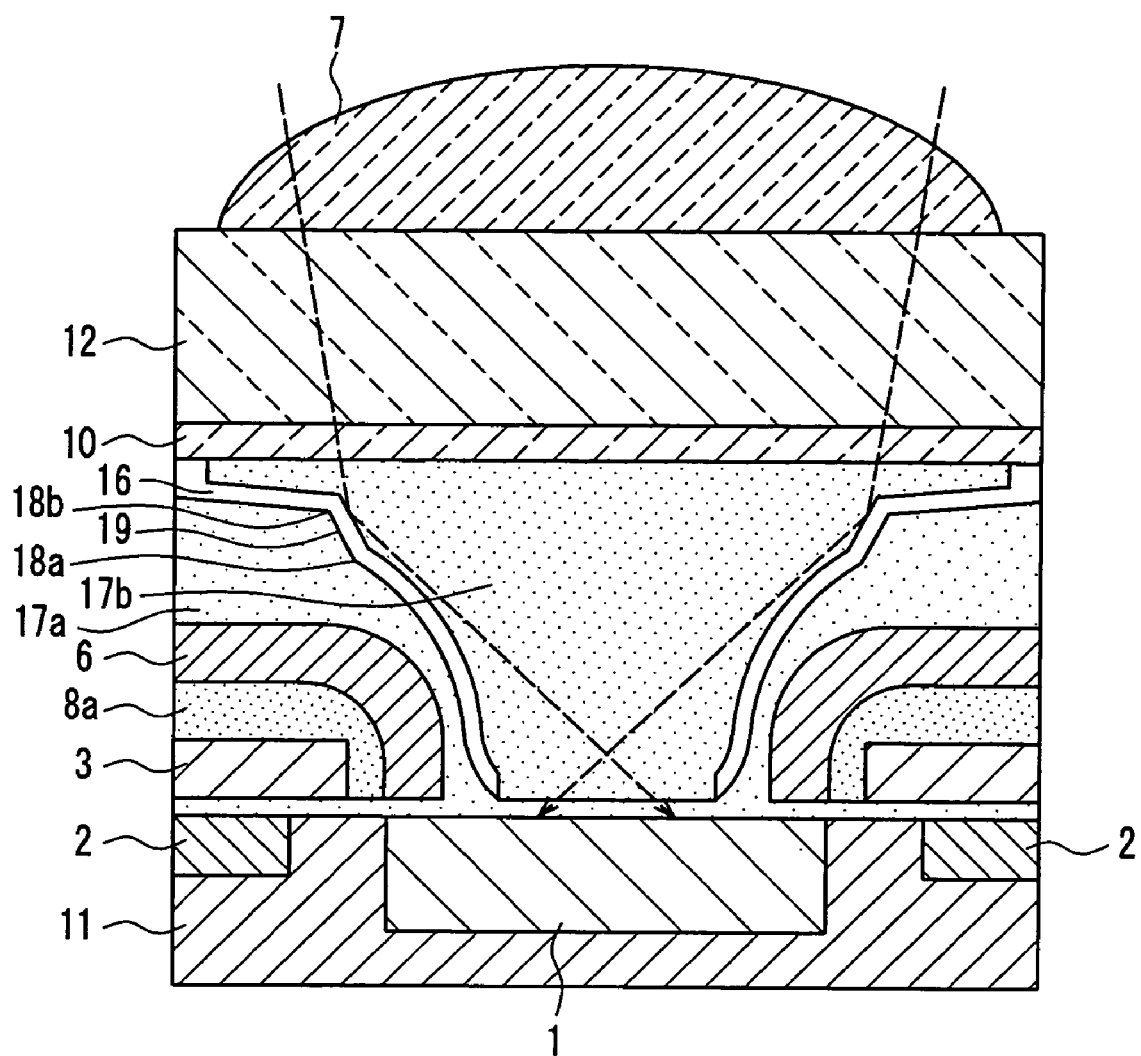
FIG. 3 is a cross sectional view showing the cross-sectional structure of a solid-state imaging device according to the second embodiment.

The solid-state imaging device according to a second embodiment is described with reference to FIG. 3. FIG. 3 shows the cross-sectional structure of a solid-state imaging device according to the second embodiment, and corresponds to the section taken along the line A–A' of FIG. 9.

The structural elements in FIG. 3 that are identical to the structural elements shown in FIG. 1, which shows the first embodiment, are assigned identical reference numerals and the description thereof is omitted. In the present embodiment, the shape of an outer wall dielectric film 17a and an inner wall dielectric film 17b, which form a hollow layer 16, is different from the hollow layer 9 of the first embodiment.

The outer wall dielectric film 17a has curved portions 18a and 18b in regions outside the aperture portion of the photodiode 1 but inward from the border portion of the unit cell, which includes one photodiode 1, and a step portion 19 is formed between the curved portions 18a and 18b. The shape of the hollow layer 16 maintains a constant angle at the step portion 19, which is the upper aperture portion of a funnel-shaped lateral wall. The formation of the curved portions 18a and 18b allows this shape to be obtained easily.

In the above structure, the refractive index difference that is obtained at the border between the hollow layer 16 and the inner wall dielectric film 17b causes total reflection to occur at that border, and thus, like in the first embodiment, the above structure has the function of effectively guiding incident light to the photodiode 1. Moreover, in the present embodiment, the funnel upper aperture shape of the hollow layer 16 stays at a constant angle up to the border portion of the unit photodiode, and thus incident light from the lens 7 can be guided to the photodiode 1 over a wider range.

More specifically, light that is outside of focusing by the lens 7 above the photodiode 1 is incident at a near right angle on border portions in a line with the photodiode 1. To counter this, the region of the hollow layer 16 that is formed at an angle that results in total reflection (for example, in the case of the first embodiment, 48.1°) has been expanded to include more surrounding regions. Light that is totally reflected by such surrounding regions is again totally reflected by the hollow layer 16 near the area directly above the aperture portion of the photodiode 1 and becomes incident on the photodiode 1. In other words, light from the lens 7, as well as light that passes through regions outside the lens 7, such as the border region of the lens 7, can be guided to the photodiode 1 over a wide range.

In a shape where the step portion 19 is not present, the hollow layer approaches a parallel state with the substrate at portions higher than the portion corresponding to the curved portion 18a, which is the lower border of the step portion 19, and total reflection does not occur for the angle of the incident light, and its function of guiding the incident light is lost. However, because the step portion 19 is present, the hollow layer 16 can maintain an angle at which total reflection occurs over a wider range, and the incident light from the lens 7 can be guided to the photodiode 1 over an even wider range than the aperture portion of the light-blocking film 6.

In particular, in CCD solid-state imaging devices, the surface area of the aperture portion of the photodiode 1 is small compared to the surface area of the repeated unit pixels, and thus the ability to effectively guide peripheral incident light to the photodiode 1 has an extremely large effect on increasing sensitivity.

Figure 4A:
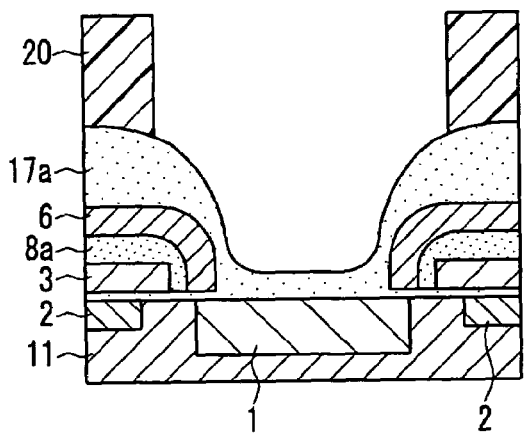
FIGS. 4A to 4C are cross sectional views showing the method for manufacturing that solid-state imaging device.

The method for manufacturing the solid-state imaging device of the present embodiment is described with reference to FIGS. 4A to 4C. FIG. 4A shows a state in which the pattern for a photoresist 20 has been formed after forming the light-blocking film 6 and then forming the outer wall dielectric film 17a. The processes up to forming the outer wall dielectric film 17a are identical to those of the method for manufacturing the conventional solid-state imaging device. The pattern of the photoresist 20 is formed such that it has an aperture in a region that is larger than the aperture portion of the photodiode 1 and smaller than the border portion of the unit cell.

Figure 4B:
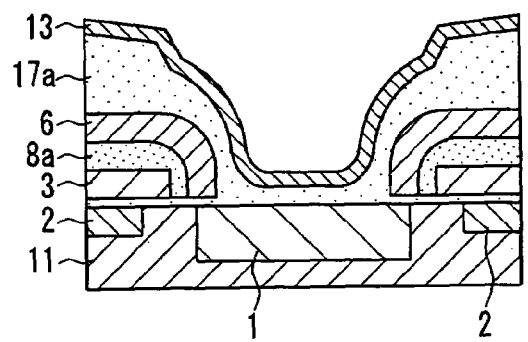

Next, as shown in FIG. 4B, the outer wall dielectric film 17a is etched down to a predetermined depth with the photoresist 20 serving as a mask. The photoresist 20 is then removed, and a hollow forming dielectric film 13 having SiN as a main component is formed. The hollow forming dielectric film 13 is formed using a method for forming a SiN film in which the formation temperature of the film is lowered using plasma or UV light, for example.

Figure 4C:
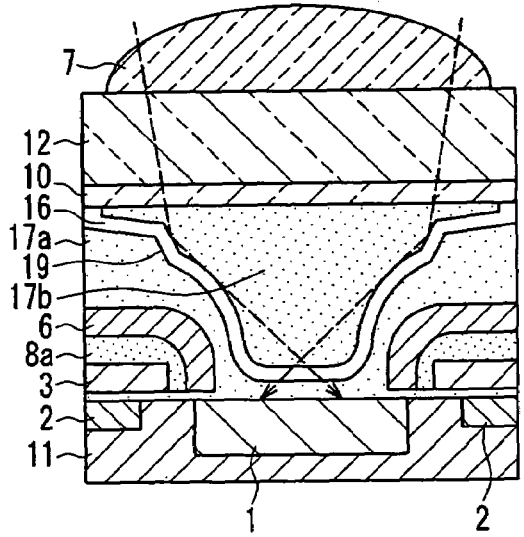

Thereafter, the same processes as those of the manufacturing method of the solid-state imaging device of the first embodiment are executed to provide the product shown in FIG. 4C, in which the processes up to forming the organic film lens 7 have been completed. That is, from the state shown in FIG. 4B, the hollow forming dielectric film 13 is etched so that it is open above the photodiode 1, next the inner wall dielectric film 17b is formed and planarized, and then the inner wall dielectric film 17b is etched at the border portion with adjacent unit cells, forming the exposed portion. Then, the hollow forming dielectric film 13, which has SiN as a main component, is etched from the exposed portion of the inner wall dielectric film 17b, forming the hollow layer 16. The entire structure is then covered by the protective film 10, after which the organic film 12 and the organic film lens 7 are formed.

In the above example, the step portion 19 is provided only at a single location, but by performing the steps of FIG. 4A and FIG. 4B a plurality of times, it is also possible to form a structure provided with a plurality of step portions.

Figure 5:
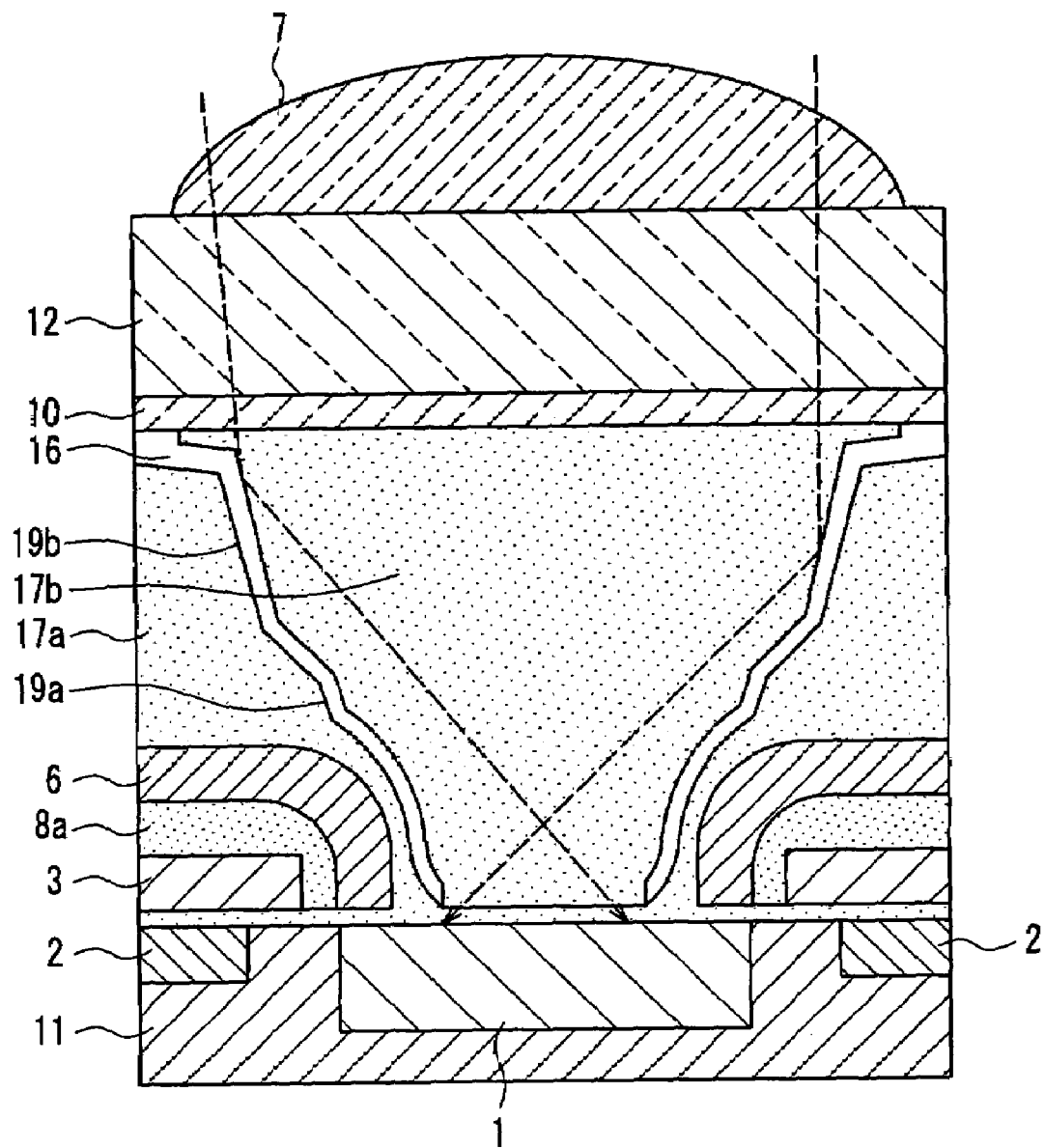
FIG. 5 is a cross sectional view showing another example of a cross-sectional structure of the solid-state imaging device according to the second embodiment.

FIG. 5 shows the cross-sectional structure of an example of the present embodiment in which a plurality of step portions 19a and 19b have been formed. In this example, a plurality of step portions 19a and 19b are provided, thereby allowing light that is incident over a wider surrounding region to be guided to the photodiode 1 due to total reflection.

Figure 6:
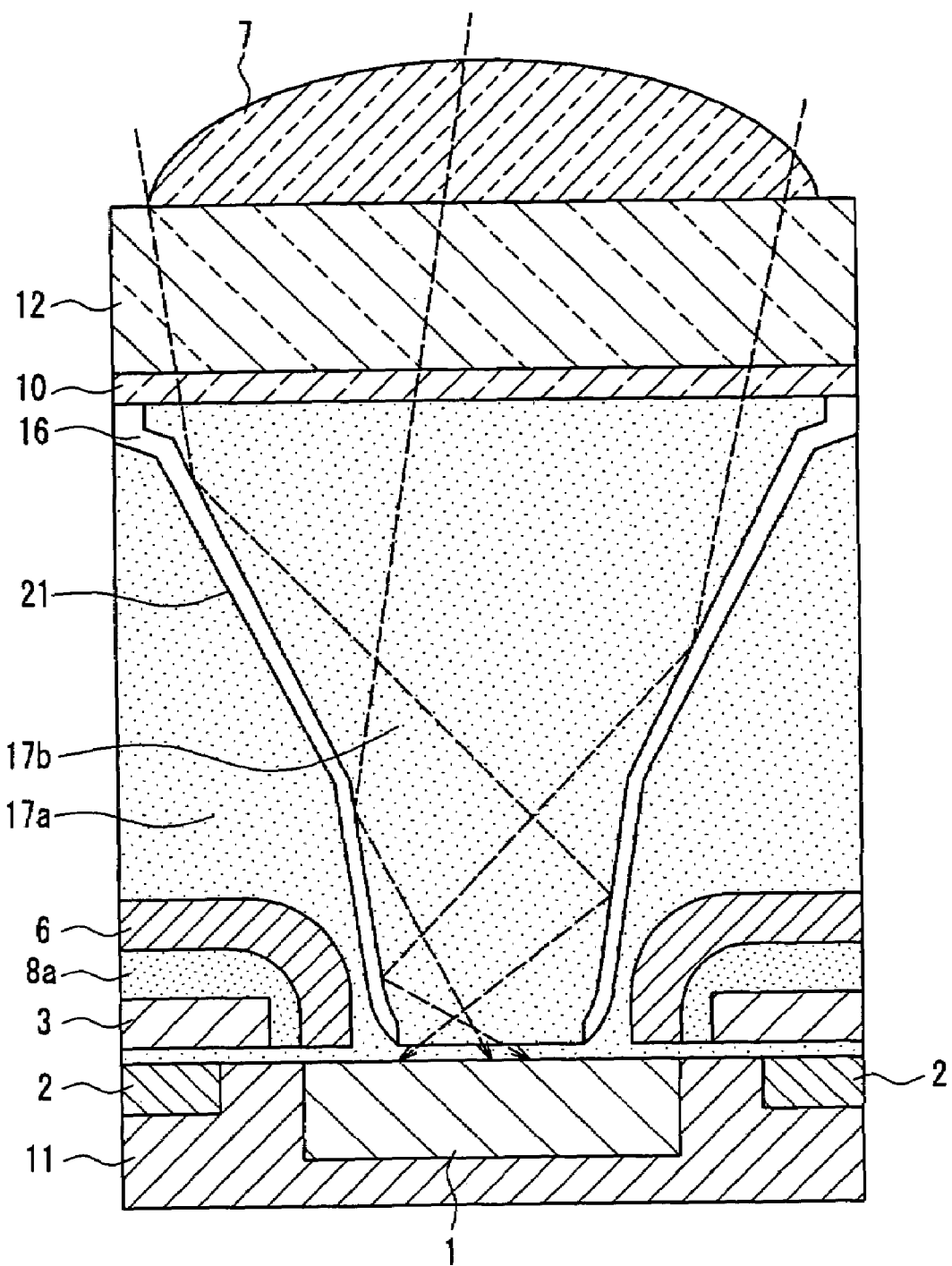
FIG. 6 is a cross sectional view showing yet another example of a cross-sectional structure of a solid-state imaging device according to the second embodiment.

FIG. 6 shows the cross-sectional structure of an example of the present embodiment in which the photodiode 1 is formed deep with respect to the surrounding outer wall dielectric film 17a, and a large step portion 21 is formed. As a structure in which the photodiode 1 has been formed deep with respect to the outer wall dielectric film 17a, a case in which multiple wiring layers, for example, have been formed within the outer wall dielectric film 17a and the insulating film between the wiring layers is formed high with respect to the photodiode 1 is possible, and it is also possible simply to form a thick dielectric film.

With this embodiment, light can be effectively guided to the photodiode 1, even if the photodiode 1 is formed in a deep portion, by providing the step 21 and setting it to an angle that results in total reflection even for peripheral incident light.

It should be noted that in the drawings showing the present embodiment, the vertical transfer portion 2 is formed adjacent to the photodiode 1 and the light-blocking film 6 is formed above the vertical transfer portion 2, but in the present invention the incident light can be guided efficiently to the photodiode by total reflection, keeping unnecessary light from entering the vertical transfer portion 2, and thus the light-blocking film 6 is not absolutely necessary. Even if there is an adjacent transistor for charge detection like in MOS sensors, or the light-blocking film is not formed, it should be obvious that the same effects as in the embodiment described are obtained.

Third Embodiment

Figure 7:
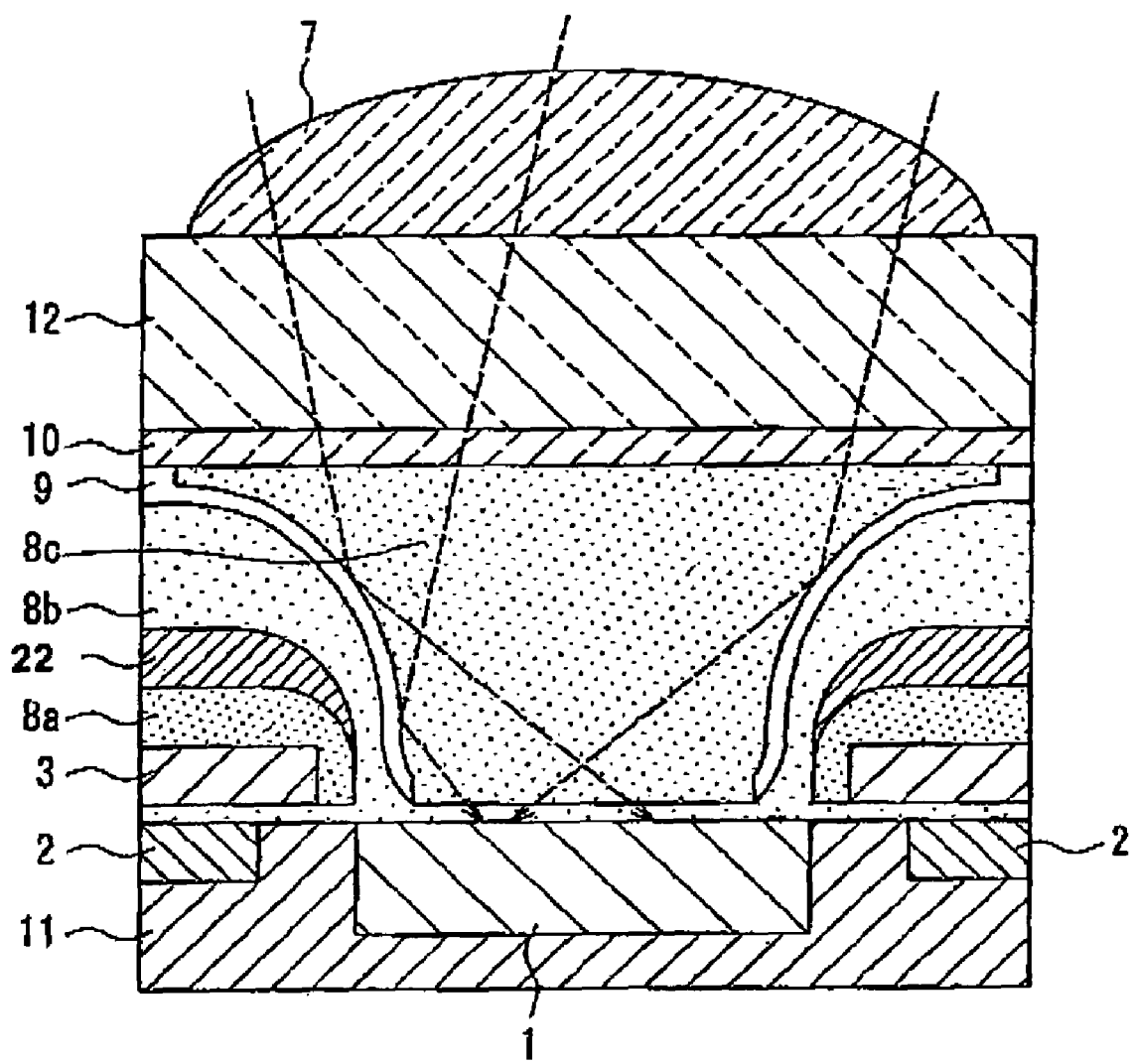
FIG. 7 is a cross sectional view showing the cross-sectional structure of a solid-state imaging device according to the third embodiment.

A solid-state imaging device according to a third embodiment is described with reference to FIG. 7. FIG. 7 shows the cross-sectional structure of a solid-state imaging device according to the present embodiment, and corresponds to the section taken along the line A–A' of FIG. 9.

The structural elements in FIG. 7 that are identical to the structural elements shown in FIG. 1 that shows the first embodiment are assigned identical reference numerals and description thereof is omitted. In the present embodiment, the shape of a light-blocking film 22 is different from that of the light-blocking film 6 of the first embodiment. In the present embodiment, the light-blocking film 22 does not cover the lateral surface of the vertical transfer gate 3, leaving a large aperture for the photodiode 1.

With the conventional technology, useless light is incident from the lateral surface of the vertical transfer gate 3 unless a light-blocking film is present there, and thus the smear properties were poor. In contrast to this, in the present embodiment the incident light is guided by the hollow layer 9, and thus useless incident light from this portion is inhibited. Consequently, a large aperture for the photodiode 1 can be obtained without causing a drop in the smear properties, and this allows the sensitivity properties to be increased significantly. This results in a synergistic effect between the technologies for forming the hollow layer 9 and widening the aperture.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A solid-state imaging device comprising:
   a plurality of photodiodes arranged in a one-dimensional or a two-dimensional arrangement;
   an inorganic dielectric film made of a translucent inorganic substance formed on the photodiode; and
   a hollow layer that is formed within the inorganic dielectric film and sandwiched between an inner lateral wall and an outer lateral wall formed with the inorganic dielectric film;
   wherein the hollow layer has a funnel shape whose aperture widens from an end portion near an upper portion of the photodiode with increasing distance from the photodiode.

2. The solid-state imaging device according to claim 1, further comprising:
   a CCD tat is disposed adjacent to the photodiode and that transfers charge that has been photoelectrically converted and held by the photodiode; and
   a light-blocking film that is formed below the hollow layer and covers the CCD, and that has an aperture portion above the photodiode;
   wherein the end portion of the hollow layer is positioned inward of the aperture portion of the light-blocking film.

3. The solid-state imaging device according to claim 2, wherein the aperture of the hollow layer at a position that is located a predetermined distance away from the photodiode is larger than the aperture portion of the light-blocking film.

4. The solid-state imaging device according to claim 1, wherein the inner lateral wall and the outer lateral wall made of the inorganic dielectric film that form the hollow layer are formed substantially parallel.

5. The solid-state imaging device according to claim 2, wherein an end portion of the light-blocking film in the vicinity of the photodiode is positioned higher than the lowest portion of the hollow layer.

6. The solid-state imaging device according to claim 3, wherein an end portion of the light-blocking film in the vicinity of the photodiode is positioned higher than the lowest portion of the hollow layer.

7. The solid-state imaging device according to claim 1, wherein the hollow layer has a step portion.

* * * * *